US012672372B2

(12) United States Patent
Chen et al.

(10) Patent No.: US 12,672,372 B2
(45) Date of Patent: Jun. 30, 2026

(54) FRONTSIDE-ILLUMINATED IMAGE SENSOR

(71) Applicant: ENKRIS SEMICONDUCTOR, INC., Suzhou (CN)

(72) Inventors: Yuchao Chen, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 393 days.

(21) Appl. No.: 18/556,873

(22) PCT Filed: Jun. 18, 2021

(86) PCT No.: PCT/CN2021/101074
§ 371 (c)(1),
(2) Date: Oct. 23, 2023

(87) PCT Pub. No.: WO2022/261978
PCT Pub. Date: Dec. 22, 2022

(65) Prior Publication Data
US 2024/0222400 A1     Jul. 4, 2024

(51) Int. Cl.
*H10F 39/00*          (2025.01)
(52) U.S. Cl.
CPC ..... *H10F 39/8033* (2025.01); *H10F 39/8037* (2025.01); *H10F 39/811* (2025.01)
(58) Field of Classification Search
CPC . H10F 39/8033; H10F 39/8037; H10F 39/811
(Continued)

(56) References Cited

U.S. PATENT DOCUMENTS 8,022,452 B2 * 9/2011 Wang .................... H10F 39/807
257/446
10,861,887 B2 12/2020 Lee et al.
(Continued)

FOREIGN PATENT DOCUMENTS

CN          1828949 A     9/2006
CN        102623475 A     8/2012
(Continued)

OTHER PUBLICATIONS

ISA State Intellectual Property Office of the People's Republic of China, International Search Report Issued in Application No. PCT/CN2021/101074, Jan. 26, 2022, WIPO, 4 pages.
(Continued)

*Primary Examiner* — Jami Valentine Miller
(74) *Attorney, Agent, or Firm* — Carroll, Hoette & Butscher, LLC; Christopher R. Carroll

(57)          ABSTRACT

The present application provides a frontside-illuminated image sensor, including a substrate, a photosensitive unit, and a lens structure. The substrate has a plurality of charge storage regions; The photosensitive unit is above the substrate, and the photosensitive unit includes a plurality of photosensitive sub-units. Each photosensitive sub-unit includes a red photosensitive layer, a green photosensitive layer, and a blue photosensitive layer that are stacked. One photosensitive sub-unit is electrically connected with one charge storage region; the lens structure is on a side of the photosensitive unit away from the substrate.

9 Claims, 4 Drawing Sheets

(58) Field of Classification Search
    USPC ........................................................ 257/432
    See application file for complete search history.

(56) References Cited

U.S. PATENT DOCUMENTS

| | | | |
|---|---|---|---|
| 12,002,828 B2 * | 6/2024 | Tsao .................... | H10F 39/8053 |
| 2006/0261242 A1 | 11/2006 | Kim | |
| 2010/0258822 A1 * | 10/2010 | Kobayashi .......... | H01L 25/0753 |
| | | | 257/E33.001 |
| 2014/0125972 A1 * | 5/2014 | Namba .............. | H10F 39/8063 |
| | | | 356/213 |
| 2018/0190697 A1 * | 7/2018 | Lee ........................ | H10F 39/014 |
| 2019/0129510 A1 * | 5/2019 | Wang ...................... | G06F 3/017 |
| 2019/0204439 A1 * | 7/2019 | Lu ........................... | G01S 17/89 |
| 2019/0288027 A1 * | 9/2019 | Su ......................... | H10F 39/024 |
| 2020/0184884 A1 * | 6/2020 | Lau .................... | H10H 20/8512 |
| 2020/0296336 A1 * | 9/2020 | Higashitsutsumi .... | H04N 23/20 |
| 2021/0066362 A1 | 3/2021 | Lee et al. | |
| 2021/0234114 A1 * | 7/2021 | Li ........................... | H10K 59/65 |
| 2021/0272996 A1 * | 9/2021 | Tsao ...................... | H10F 39/807 |
| 2024/0243161 A1 * | 7/2024 | Chen ..................... | H10F 39/811 |
| 2024/0258359 A1 * | 8/2024 | Chen .................. | H10F 39/8063 |

FOREIGN PATENT DOCUMENTS

| | | |
|---|---|---|
| CN | 108269813 A | 7/2018 |
| CN | 110797366 A | 2/2020 |

OTHER PUBLICATIONS

ISA State Intellectual Property Office of the People's Republic of China, Written Opinion of the International Searching Authority Issued in Application No. PCT/CN2021/101074, Jan. 26, 2022, WIPO, 3 pages.

* cited by examiner

FRONTSIDE-ILLUMINATED IMAGE SENSOR

CROSS-REFERENCE TO RELATED APPLICATIONS

This application is a national stage of international PCT Application No. PCT/CN2021/101074 filed on Jun. 18, 2021, the entire contents of which are incorporated herein by reference.

TECHNICAL FIELD

The present application relates to the field of semiconductor technology, and in particular to a frontside-illuminated image sensor.

BACKGROUND

Image sensors utilize the photoelectric conversion capability of photoelectric devices to convert an optical image on a photosensitive surface into electrical signals proportionally corresponding to the optical image. Compared with photosensitive components of point light sources such as photodiodes and phototransistors, the image sensor is a functional device that divides the optical image on its receiving (photosensitive) surface into many small units and converts them into usable electrical signals. The image sensor is categorized into a photoconductive camera tube and a solid-state image sensor. Compared with the photoconductive camera tube, the solid-state image sensor has characteristics of small size, light weight, high integration, high resolution, low power consumption, long lifespan, and low price, making the solid-state image sensor widely used in various industries.

Currently, most image sensors utilize a backside-illuminated CMOS (Complementary Metal-Oxide-Semiconductor Transistor) structure. The shortcomings of backside-illuminated image sensors lie in the followings: first, it is required to prepare photodiodes for photoelectric conversion and an electrical interconnection structure on the front of a silicon wafer, and prepare filter structures and lenses on the back of the silicon wafer, the process of which is complex and the front photodiodes need to be aligned with the back filter structures and lenses, which will result in low yield of backside-illuminated image sensors: second, the large area occupied by photodiodes limits the space for charge storage and storage capacitors, which increases the design difficulty for high dynamic range (HDR) performance and global shutter capacitor design: third, during the process of light propagation to photodiodes within silicon wafers, there is significant crosstalk, and a deep groove isolation structure needs to be made to separate the light propagating to adjacent photodiodes, which is a complex process.

In addition, in photodiodes, with the increasing demand for dynamic range and the popularization of global shutter applications, the requirements for larger full well capacity and larger storage capacitance are becoming increasingly high. At present, the solutions on the market mainly focus on redesigning photodiodes and storage capacitors and modifying circuits to match them, without substantially changing the total storage space, and the difficulty of circuit design is further increased: the requirement of the backside-illuminated CMOS structure further increases the difficulty of the process.

SUMMARY

The purpose of the present application is to provide a frontside-illuminated image sensor to address deficiencies in related technologies.

To achieve the above purpose, the present application provides a frontside-illuminated image sensor, including:

a substrate having a plurality of charge storage regions;

a photosensitive unit above the substrate: where the photosensitive unit includes a plurality of photosensitive sub-units, each of the plurality of photosensitive sub-units includes a red photosensitive layer, a green photosensitive layer, and a blue photosensitive layer that are stacked; and where one photosensitive sub-unit is electrically connected with one charge storage region; and a lens structure on a side of the photosensitive unit away from the substrate.

In some embodiments, materials of the red photosensitive layer, the green photosensitive layer, and the blue photosensitive layer are GaN based materials containing indium (In), and proportions of In components thereof are different, so as to generate or not generate photosensitive charges based on wavelength of received light and store the photosensitive charges in a corresponding charge storage region.

In some embodiments, a proportion of In component in the red photosensitive layer ranges from 0.4 to 0.6;

a proportion of In component in the green photosensitive layer ranges from 0.2 to 0.3; and a proportion of In component in the blue photosensitive layer ranges from 0.01 to 0.1.

In some embodiments, in each photosensitive sub-unit, the red photosensitive layer is away from the substrate, the blue photosensitive layer is close to the substrate, and the green photosensitive layer is between the red photosensitive layer and the blue photosensitive layer.

In some embodiments, there are a plurality of transistors on the substrate, and a source region or a drain region of at least one transistor is the charge storage region: there is a metal interconnection layer between the substrate and the photosensitive unit, and metal interconnection structure of the metal interconnection layer is configured to electrically connect with the plurality of transistors.

In some embodiments, at least one of the plurality of transistors is provided with a photosensitive processing circuit, the photosensitive processing circuit is configured to detect a photosensitive electrical signal generated by the photosensitive sub-unit;

if a photosensitive electrical signal intensity detected by the photosensitive processing circuit from the photosensitive sub-unit is greater than a first threshold, a blue light incident signal is stored;

if the photosensitive electrical signal intensity detected by the photosensitive processing circuit from the photosensitive sub-unit that is greater than a second threshold and less than the first threshold, a green light incident signal is stored;

if the photosensitive electrical signal intensity detected by the photosensitive processing circuit from the photosensitive sub-unit is less than or equal to the second threshold, a red light incident signal is stored.

In some embodiments, the metal interconnection layer has a conductive plug, with one end of the conductive plug connected with the photosensitive sub-unit and a second end of the conductive plug electrically connected with one of the plurality of charge storage regions.

In some embodiments, the second end of the conductive plug is connected with a side wall of one photosensitive sub-unit.

In some embodiments, there is a light blocking structure between adjacent photosensitive sub-units.

In some embodiments, a material of the light blocking structure includes a metal molybdenum, an alloy of metal molybdenum, a metal aluminum, or an alloy of metal aluminum.

Figure 1:
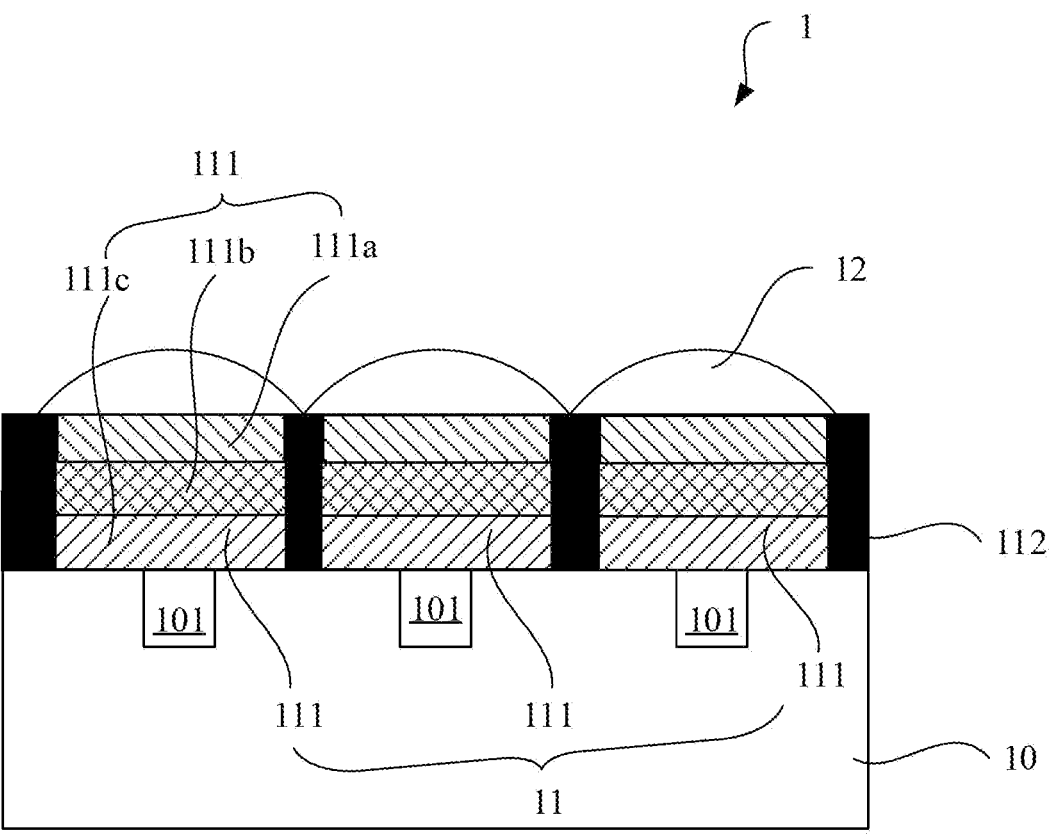
FIG. 1 is a cross-sectional schematic diagram of a fronts-ide-illuminated image sensor according to a first embodiment of the present application.

For the convenience of understanding the present application, all accompanying figures appearing in the present application are marked as follows:

| | |
|---|---|
| frontside-illuminated image sensor 1, 2, 3, 4 | substrate 10 |
| charge storage region 101 | photosensitive unit 11 |
| red photosensitive layer 111a | green photosensitive layer 111b |
| blue photosensitive layer 111c | photosensitive sub-unit 111 |
| lens structure 12 | light blocking structure 112 |
| photosensitive processing circuit 13 | transistor 102 |
| metal interconnection layer 14 | metal interconnection structure 141 |
| conductive plug 142 | |

DETAILED DESCRIPTION

In order to make the above objectives, features, and advantages of the present application more apparent and understandable, the specific embodiments of the present application will be explained in detail below in conjunction with the accompanying drawings.

FIG. 1 is a cross-sectional schematic diagram of a fronts-ide-illuminated image sensor according to a first embodiment of the present application.

As shown in FIG. 1, the frontside-illuminated image sensor 1 includes:

a substrate 10 having a plurality of charge storage regions 101;

a photosensitive unit 11 above the substrate 10; where the photosensitive unit 11 includes a plurality of photosensitive sub-units 111, each of the plurality of photosensitive sub-units 111 includes a red photosensitive layer 111a, a green photosensitive layer 111b, and a blue photosensitive layer 111c that are stacked; and where one photosensitive sub-unit 111 is electrically connected with one charge storage region 101; and a lens structure 12 on a side of the photosensitive unit 11 away from the substrate 10.

The substrate 10 can be a monocrystalline silicon substrate. The charge storage region 101 can be a floating diffusion (FD) region, for example, an n-type lightly doped region formed in a p-type well can serve as a floating diffusion region.

Materials of the red photosensitive layer 111a, the green photosensitive layer 111b, and the blue photosensitive layer 111c are GaN based materials containing indium (In), and the proportions thereof of In components are different, so as to generate or not generate photosensitive charges based on wavelength of received light and store them in a corresponding charge storage region 101.

The proportion of In component in the red photosensitive layer 111a can be greater than that of In component in the green photosensitive layer 111b, and the proportion of In component in the green photosensitive layer 111b can be greater than that of In component in the blue photosensitive layer 111c.

The proportion of In component in the red photosensitive layer 111a can range from 0.4 to 0.6, and a wavelength of light required to generate photosensitive current thereof can range from 400 nm to 720 nm.

The proportion of In component in the green photosensitive layer 111b can range from 0.2 to 0.3, and a wavelength of light required to generate photosensitive current thereof can range from 400 nm to 600 nm.

The proportion of In component in the blue photosensitive layer 111c can range from 0.01 to 0.1, and a wavelength of light required to generate photosensitive current thereof can range from 400 nm to 500 nm.

It should be noted that the proportion of In component in the red photosensitive layer 111a refers to a percentage of the amount of substance of In element in the amount of substance of all positively charged elements in the red photosensitive layer 111a. For example, if the material of the red photosensitive layer 111a is InGaN, and the proportion of In component refers to a percentage of the amount of substance of In element in the sum of the amount of substance of In element and the amount of substance of gallium (Ga) element: if the material of the red photosensitive layer 111a is InAlGaN, and the proportion of In component refers to a percentage of the amount of substance of In element in the sum of the amount of substance of In element, the amount of substance of aluminum (Al) element, and the amount of substance of gallium (Ga) element.

The proportion of In component in the green photosensitive layer 111b refers to a percentage of the amount of substance of In element in the amount of substance of all positively charged elements in the green photosensitive layer 111b.

The proportion of In component in the blue photosensitive layer 111c refers to a percentage of the amount of substance of In element in the amount of substance of all positively charged elements in the blue photosensitive layer 111c.

In addition, in this embodiment, each of the plurality of ranges includes endpoint values.

In this way, for each photosensitive sub-unit 111, if illuminated by blue light, the red photosensitive layer 111a, the green photosensitive layer 111b, and the blue photosensitive layer 111c can all generate photosensitive electrical signals. If illuminated by green light, the red photosensitive layer 111a and the green photosensitive layer 111b can generate photosensitive electrical signals. If illuminated by red light, only the red photosensitive layer 111a can generate a photosensitive electrical signal. In other words, for the same photosensitive sub-unit 111, the photosensitive electrical signal intensity generated by blue light irradiation is greater than that generated by green light irradiation, and the photosensitive electrical signal intensity generated by green light irradiation is greater than that generated by red light irradiation. Therefore, even if the structure of each photosensitive sub-unit 111 is the same, the color and brightness of the illuminated light can still be distinguished by an intensity of the photosensitive signal.

In some embodiments, in each photosensitive sub-unit 111, the red photosensitive layer 111a is away from the substrate 10, the blue photosensitive layer 111c is close to the substrate 10, and the green photosensitive layer 111b is between the red photosensitive layer 111a and the blue photosensitive layer 111c. One of the advantages of the above arrangement is that it can prevent red light from decaying too quickly when passing through respective photosensitive layers.

The lens structure 12 includes a plurality of lenses, with one lens above each photosensitive sub-unit 111.

In addition, in this embodiment, there is a light blocking structure 112 between adjacent photosensitive sub-units 111. Before epitaxial growth of blue photosensitive layer 111c, green photosensitive layer 111b, and red photosensitive layer 111a on the substrate 10, a plurality of light blocking structures 112 can be formed above substrate 10.

A material of the light blocking structure 112 can include a metal molybdenum, an alloy of metal molybdenum, a metal aluminum, or an alloy of metal aluminum. To prevent crosstalk between adjacent photosensitive layers, insulation sidewalls (spacers) can be installed on side walls of the light blocking structure 112. The material of the insulation sidewall can include silicon nitride or silicon dioxide.

In this embodiment, first, the image sensor is a frontside-illuminated image sensor 1, which can avoid making a structure on a back of the substrate 10, thus avoiding alignment between the front structure and the back structure, the process thereof is simple and the yield is high: second, one photosensitive sub-unit 111 is electrically connected with one charge storage region 101, greatly reducing crosstalk caused by light propagation.

Figure 2:
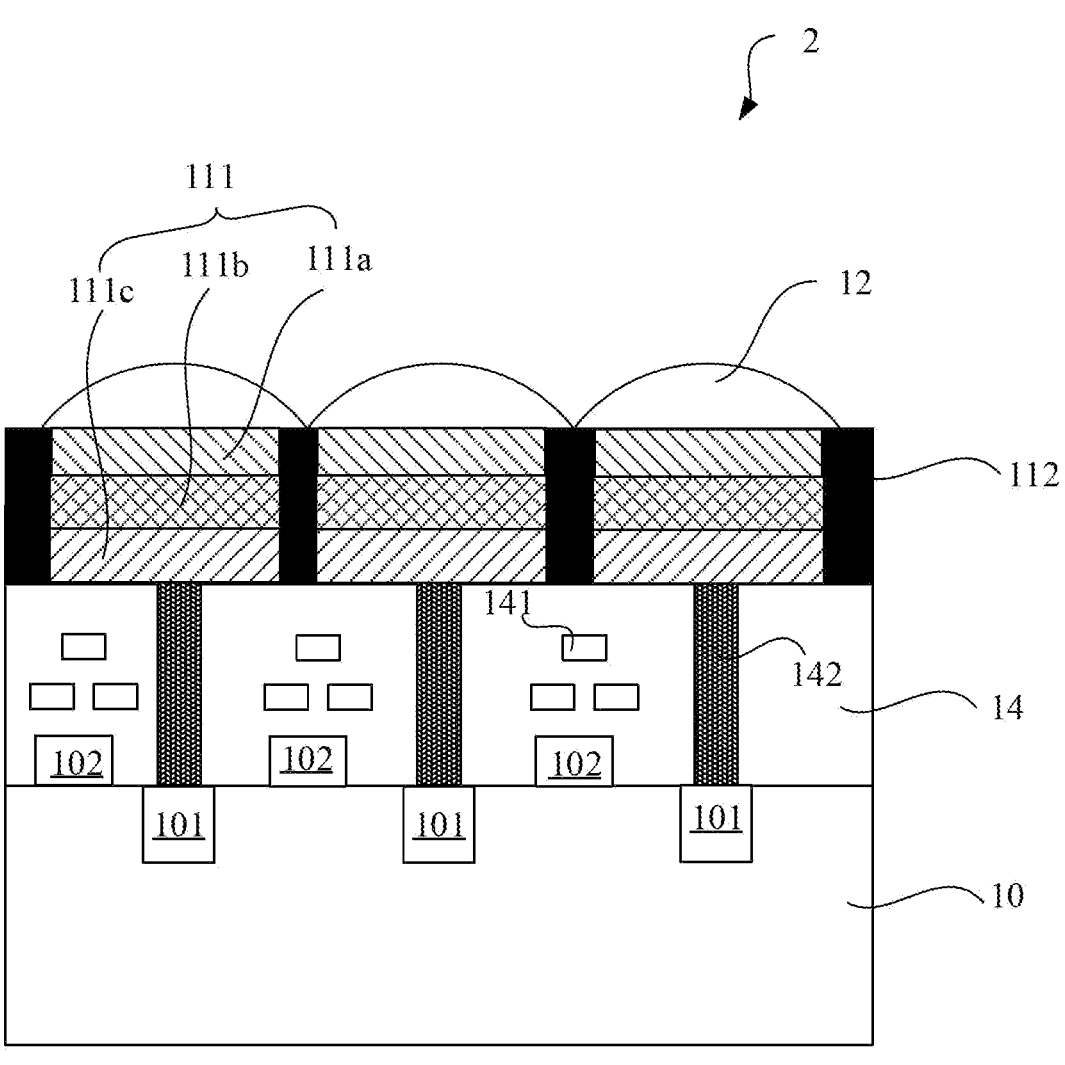
FIG. 2 is a cross-sectional schematic diagram of a fronts-ide-illuminated image sensor according to a second embodiment of the present application.

FIG. 2 is a cross-sectional schematic diagram of a frontside-illuminated image sensor according to a second embodiment of the present application.

Referring to FIG. 2 and FIG. 1, the frontside-illuminated image sensor 2 of embodiment 2 is substantially the same as the frontside-illuminated image sensor 1 of embodiment 1, except that there are a plurality of transistors 102 on the substrate 10, and a source region or a drain region of at least one transistor is the charge storage region 101: there is a metal interconnection layer 14 between the substrate 10 and the photosensitive unit 11, and a metal interconnection structure 141 of the metal interconnection layer 14 is configured to electrically connect with the plurality of transistors 102.

The transistor 102 can include: a transfer transistor, a reset transistor, a source follower transistor, and a row selection transistor. A source electrode of the transfer transistor is electrically connected with a photosensitive layer through a metal interconnection structure 141, and a drain electrode thereof represents a floating diffusion region. Therefore, the transfer transistor is configured to transfer photoelectric charges from a photosensitive layer to a floating diffusion region. A source electrode of the reset transistor represents a floating diffusion region, and a drain electrode thereof is electrically connected with a power supply voltage line through a metal interconnection structure 141. Therefore, the reset transistor is configured to reset the floating diffusion region to the power supply voltage VDD. Through the metal interconnection structure 141, a gate electrode of the source follower transistor is electrically connected with the floating diffusion region, a source electrode thereof is electrically connected with the power supply voltage VDD, and a drain electrode thereof is electrically connected with a source electrode of the row selection transistor. Through the metal interconnection structure 141, a gate electrode of the row selection transistor is electrically connected with a row scanning line for outputting a drain voltage of the source follower transistor in response to an address signal. The source electrode and drain electrode mentioned above can be exchanged according to the current flow direction.

In addition, as shown in FIG. 2, the metal interconnection layer 14 has a conductive plug 142, with a first end of the conductive plug 142 connected to one photosensitive sub-unit 111 and the second end thereof electrically connected to a charge storage region 101. Moreover, the first end of the conductive plug 142 is connected to a bottom wall of a photosensitive sub-unit 111.

In the second embodiment, the photosensitive unit 11 is above the substrate 10 instead of spreading on the surface of the substrate 10, thus providing a large design space for the charge storage region 101 and the storage capacitor, thereby obtaining a larger full well capacity, improving the high dynamic range, and naturally having global shutter design conditions.

Figure 3:
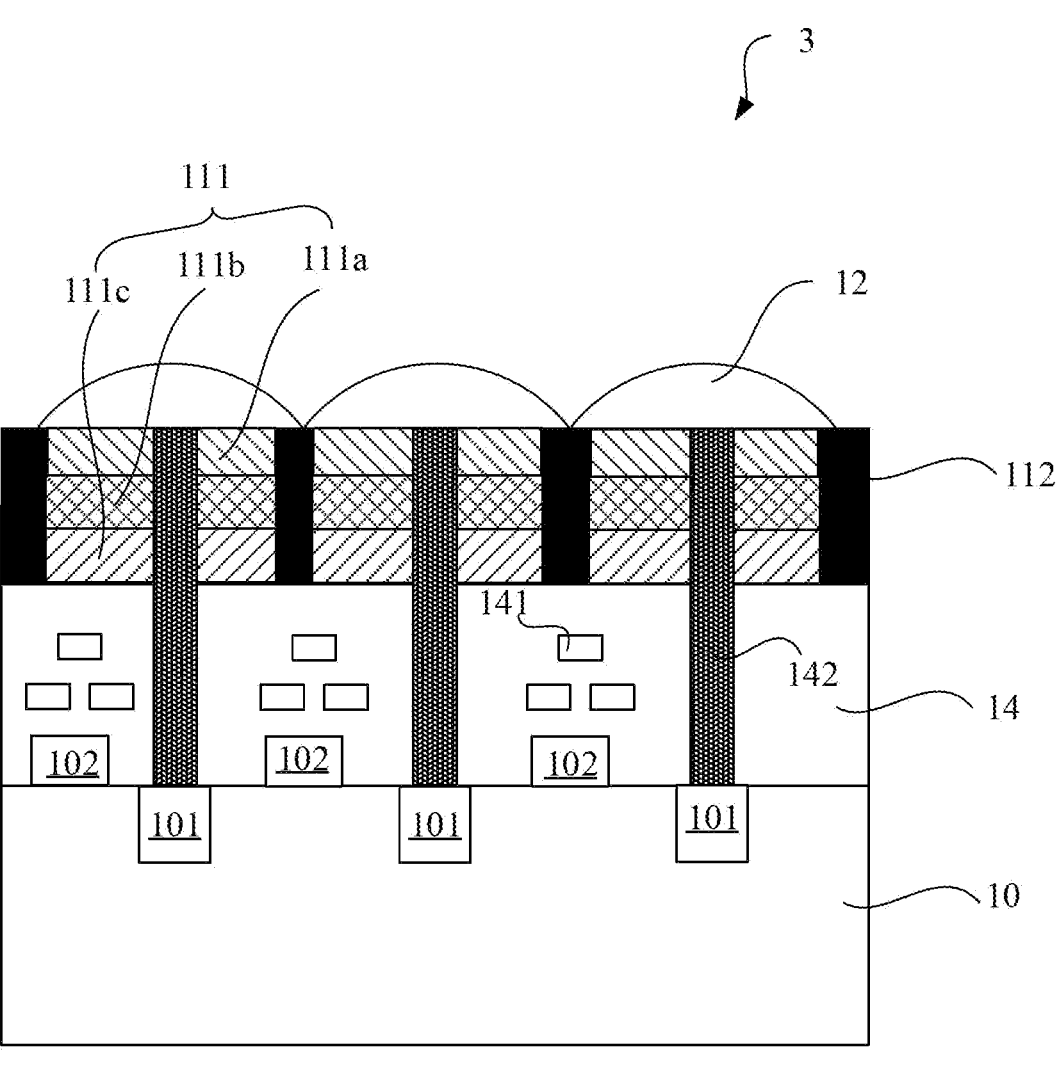
FIG. 3 is a cross-sectional schematic diagram of a fronts-ide-illuminated image sensor according to a third embodiment of the present application.

FIG. 3 is a cross-sectional schematic diagram of a frontside-illuminated image sensor according to a third embodiment of the present application.

Referring to FIG. 2 and FIG. 3, the frontside-illuminated image sensor 3 of embodiment 3 is substantially the same as the frontside-illuminated image sensor 2 of embodiment 2, except that the first end of the conductive plug 142 is connected to a side wall of the photosensitive sub-unit 111. Research has shown that for a photosensitive layer made of GaN based material containing indium, a current flowing in a plane is greater than a current flowing in a thickness direction. Therefore, the conductive plug 142 connected to the sidewalls of each photosensitive layer can increase an amount of transferred photoelectric charges.

In some embodiments, the side wall of the photosensitive sub-unit 111 connected to the first end of the conductive plug 142 is close to the light blocking structure 112.

Figure 4:
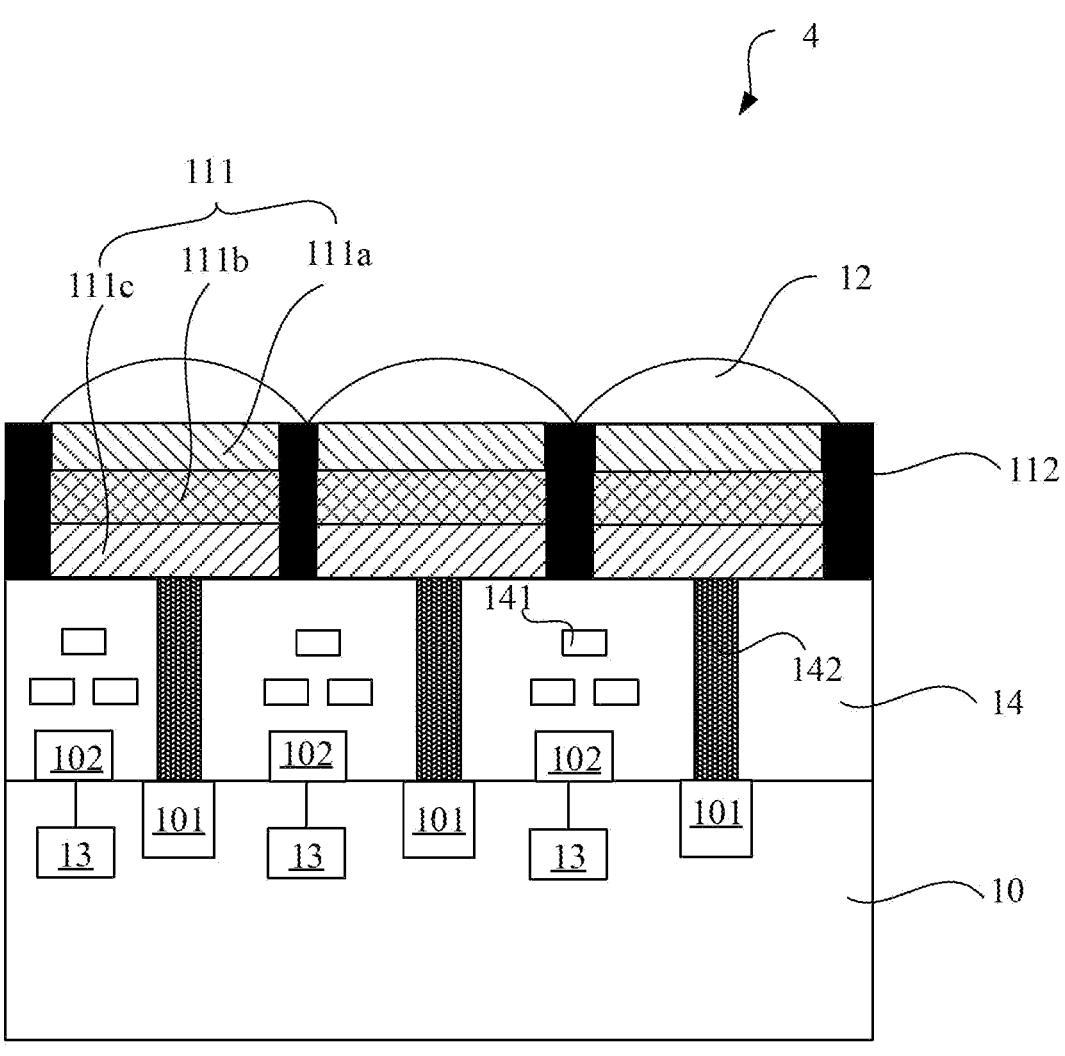
FIG. 4 is a cross-sectional schematic diagram of a fronts-ide-illuminated image sensor according to a fourth embodiment of the present application.

FIG. 4 is a cross-sectional schematic diagram of a frontside-illuminated image sensor according to a fourth embodiment of the present application.

Referring to FIG. 4, FIG. 3, and FIG. 2, the frontside-illuminated image sensor 4 of embodiment 4 is substantially the same as the frontside-illuminated image sensors 2 and 3 of embodiments 2 and 3, except that:

some of the plurality of transistors 102 are provided with a photosensitive processing circuit 13, the photosensitive processing circuit 13 is configured to detect a photosensitive electrical signal generated by the photosensitive sub-unit 111;

if a photosensitive electrical signal intensity detected by the photosensitive processing circuit 13 from the photosensitive sub-unit 111 is greater than a first threshold, a blue light incident signal is stored;

if the photosensitive electrical signal intensity detected by the photosensitive processing circuit 13 from the photosensitive sub-unit 111 that is greater than a second threshold but not less than the first threshold, a green light incident signal is stored; and if the photosensitive electrical signal intensity detected by the photosensitive processing circuit 13 from the photosensitive unit 111 is less than or equal to the second threshold, a red light incident signal is stored.

The first threshold is greater than the second threshold.

A drain electrode of the row selection transistor can be connected to an input end of the photosensitive processing circuit 13.

Compared with related art, the beneficial effects of the present application include follows: first, the photosensitive unit is above the substrate, and the lens structure is on a side of the photosensitive unit away from the substrate. In other words, the image sensor is a frontside-illuminated image sensor, which avoids making a structure on a back of the substrate, thus avoiding alignment between the front structure and the back structure, the process thereof is simple and the yield is high: second, the photosensitive unit is above the substrate instead of spreading on the surface of the substrate, such that the charge storage region and storage capacitor space can be designed to be large enough to obtain a larger full well capacity, bring about an improvement in high dynamic range, and naturally have global shutter design conditions: third, one photosensitive sub-unit is electrically connected to one charge storage region, greatly reducing crosstalk caused by light propagation.

Although the present application is disclosed as above, it is not limited to this. Any person skilled in the art can make various changes and modifications without departing from the spirit and scope of the present application. Therefore, the scope of protection of the present application shall be subject to the scope limited by the claims.

The invention claimed is:

1. A frontside-illuminated image sensor, comprising:
a substrate having a plurality of charge storage regions;
a photosensitive unit above the substrate; wherein the photosensitive unit comprises a plurality of photosensitive sub-units, each of the plurality of photosensitive sub-units comprises a red photosensitive layer, a green photosensitive layer, and a blue photosensitive layer that are stacked; and wherein one photosensitive sub-unit is electrically connected with one charge storage region, and there is a light blocking structure between adjacent photosensitive sub-units; and
a lens structure is on a side of the photosensitive unit away from the substrate.

2. The frontside-illuminated image sensor according to claim 1, wherein materials of the red photosensitive layer, the green photosensitive layer, and the blue photosensitive layer are GaN based materials containing indium element, and proportions of indium components of the red photosensitive layer, the green photosensitive layer, and the blue photosensitive layer are different, so as to generate or not generate photosensitive charges based on wavelength of received light and store the photosensitive charges in a corresponding charge storage region.

3. The frontside-illuminated image sensor according to claim 2, wherein
a proportion of indium component in the red photosensitive layer ranges from 0.4 to 0.6;

a proportion of indium component in the green photosensitive layer ranges from 0.2 to 0.3; and
a proportion of indium component in the blue photosensitive layer ranges from 0.01 to 0.1.

4. The frontside-illuminated image sensor according to claim 1, wherein in each photosensitive sub-unit, the red photosensitive layer is away from the substrate, the blue photosensitive layer is close to the substrate, and the green photosensitive layer is between the red photosensitive layer and the blue photosensitive layer.

5. The frontside-illuminated image sensor according to claim 1, wherein there are a plurality of transistors on the substrate, and a source region or a drain region of at least one transistor is one of the plurality of charge storage regions; there is a metal interconnection layer between the substrate and the photosensitive unit, and a metal interconnection structure of the metal interconnection layer is configured to electrically connect with the plurality of transistors.

6. The frontside-illuminated image sensor according to claim 5, wherein at least one of the plurality of transistors is provided with a photosensitive processing circuit, the photosensitive processing circuit is configured to detect a photosensitive electrical signal generated by the photosensitive sub-unit;
if a photosensitive electrical signal intensity detected by the photosensitive processing circuit from the photosensitive sub-unit is greater than a first threshold, a blue light incident signal is stored;
if the photosensitive electrical signal intensity detected by the photosensitive processing circuit from the photosensitive sub-unit that is greater than a second threshold but less than a first threshold, a green light incident signal is stored; and
if the photosensitive electrical signal intensity detected by the photosensitive processing circuit from the photosensitive sub-unit is less than or equal to the second threshold, a red light incident signal is stored.

7. The frontside-illuminated image sensor according to claim 5, wherein the metal interconnection layer comprises a conductive plug, a first end of the conductive plug is connected with one photosensitive sub-unit, and a second end of the conductive plug is electrically connected with one of the plurality of charge storage regions.

8. The frontside-illuminated image sensor according to claim 7, wherein the first end of the conductive plug is connected with a side wall of one photosensitive sub-unit.

9. The frontside-illuminated image sensor according to claim 1, wherein a material of the light blocking structure comprises a metal molybdenum, an alloy of metal molybdenum, a metal aluminum, or an alloy of metal aluminum.

* * * * *